(12) United States Patent
Sung et al.

(10) Patent No.: US 9,018,647 B2
(45) Date of Patent: Apr. 28, 2015

(54) THIN FILM DEPOSITION APPARATUS, METHOD OF MANUFACTURING ORGANIC LIGHT-EMITTING DISPLAY DEVICE BY USING THE APPARATUS, AND ORGANIC LIGHT-EMITTING DISPLAY DEVICE MANUFACTURED BY USING THE METHOD

(75) Inventors: Un-Cheol Sung, Yongin (KR); Beom Rak Choi, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 145 days.

(21) Appl. No.: 13/219,427

(22) Filed: Aug. 26, 2011

(65) Prior Publication Data
US 2012/0068201 A1 Mar. 22, 2012

(30) Foreign Application Priority Data

Sep. 16, 2010 (KR) .......................... 10-2010-0091091

(51) Int. Cl.
- H01L 33/08 (2010.01)
- B02C 13/00 (2006.01)
- B05C 11/00 (2006.01)
- H01L 21/677 (2006.01)

(Continued)

(52) U.S. Cl.
CPC .......... *H01L 21/6776* (2013.01); *C23C 14/042* (2013.01); *C23C 14/243* (2013.01); *C23C 14/568* (2013.01); *H01L 21/67173* (2013.01)

(58) Field of Classification Search
CPC .............. H01L 51/56; H01L 21/02678; H01L 2251/56; H01L 51/0008; H01L 51/001; H01L 51/5036
USPC ............................................... 257/88; 438/22
See application file for complete search history.

(56) References Cited

U.S. PATENT DOCUMENTS

| 4,468,648 A | 8/1984 | Uchikune |
| 5,487,609 A | 1/1996 | Asada |

(Continued)

FOREIGN PATENT DOCUMENTS

| CN | 1476279 | 2/2004 |
| CN | 1682569 | 10/2005 |

(Continued)

OTHER PUBLICATIONS

KIPO Office action dated Apr. 9, 2012, for Korean Patent application 10-2010-0031556, (4 pages).

(Continued)

*Primary Examiner* — Marc Armand
*Assistant Examiner* — Quinton Brasfield
(74) *Attorney, Agent, or Firm* — Christie, Parker & Hale, LLP (57) ABSTRACT

A thin film deposition apparatus, a method of manufacturing an organic light-emitting display device by using the thin film deposition apparatus, and an organic light-emitting display device manufactured by using the method. A thin film deposition apparatus for forming a thin film on a substrate includes a first chamber in a vacuum state; first and second stages arranged in parallel in the first chamber wherein the substrate is fixable to at least one of the first and second stages; a mask contactable with the substrate; and a first deposition source and a second deposition source that are movable relative to the first and second stages and are configured to discharge a deposition material onto the substrate.

10 Claims, 8 Drawing Sheets

(51) Int. Cl.

| | |
|---|---|
| *C23C 14/04* | (2006.01) |
| *C23C 14/24* | (2006.01) |
| *C23C 14/56* | (2006.01) |
| *H01L 21/67* | (2006.01) |

(56) References Cited

U.S. PATENT DOCUMENTS

| | | | |
|---|---|---|---|
| 5,909,995 | A | 6/1999 | Wolf et al. |
| 6,274,198 | B1 | 8/2001 | Dautartas |
| 6,371,451 | B1 | 4/2002 | Choi |
| 6,483,690 | B1 | 11/2002 | Nakajima et al. |
| 6,749,906 | B2 | 6/2004 | Van Slyke |
| 6,995,035 | B2 | 2/2006 | Cok et al. |
| 7,199,520 | B2 * | 4/2007 | Fujii et al. ............ 313/506 |
| 7,964,037 | B2 | 6/2011 | Fukuda et al. |
| 2001/0006827 | A1 | 7/2001 | Yamazaki et al. |
| 2002/0033136 | A1 | 3/2002 | Savage et al. |
| 2002/0076847 | A1 | 6/2002 | Yamada et al. |
| 2002/0168577 | A1 | 11/2002 | Yoon |
| 2002/0194727 | A1 | 12/2002 | Cho et al. |
| 2003/0101937 | A1 | 6/2003 | Van Slyke et al. |
| 2003/0151637 | A1 | 8/2003 | Nakamura et al. |
| 2003/0168013 | A1 | 9/2003 | Freeman et al. |
| 2003/0221614 | A1 | 12/2003 | Kang et al. |
| 2003/0232563 | A1 | 12/2003 | Kamiyama et al. |
| 2004/0123804 | A1 | 7/2004 | Yamazaki et al. |
| 2004/0127066 | A1 | 7/2004 | Jung |
| 2004/0134428 | A1 | 7/2004 | Sasaki et al. |
| 2004/0142108 | A1 | 7/2004 | Atobe et al. |
| 2004/0144321 | A1 | 7/2004 | Grace et al. |
| 2004/0194702 | A1 | 10/2004 | Sasaki et al. |
| 2004/0263547 | A1 | 12/2004 | Sugahara |
| 2004/0263771 | A1 | 12/2004 | Jeong et al. |
| 2005/0016461 | A1 | 1/2005 | Klug et al. |
| 2005/0031836 | A1 | 2/2005 | Hirai |
| 2005/0037136 | A1 | 2/2005 | Yamamoto |
| 2005/0166842 | A1 | 8/2005 | Sakamoto |
| 2005/0263074 | A1 | 12/2005 | Masuda et al. |
| 2006/0012771 | A1 * | 1/2006 | Jeong ....................... 355/75 |
| 2006/0102078 | A1 | 5/2006 | Fairbairn et al. |
| 2006/0144325 | A1 | 7/2006 | Jung et al. |
| 2006/0164786 | A1 | 7/2006 | Kobayashi et al. |
| 2006/0174829 | A1 | 8/2006 | An et al. |
| 2006/0205101 | A1 | 9/2006 | Lee et al. |
| 2006/0255722 | A1 | 11/2006 | Imanishi |
| 2006/0278522 | A1 | 12/2006 | Kim et al. |
| 2006/0278945 | A1 | 12/2006 | Sakurai |
| 2007/0009652 | A1 | 1/2007 | Manz et al. |
| 2007/0046913 | A1 | 3/2007 | Shibazaki |
| 2007/0077358 | A1 | 4/2007 | Jeong et al. |
| 2007/0178708 | A1 | 8/2007 | Ukigaya |
| 2007/0275497 | A1 | 11/2007 | Kwack et al. |
| 2007/0297887 | A1 | 12/2007 | Tanaka |
| 2008/0018236 | A1 | 1/2008 | Arai et al. |
| 2008/0057183 | A1 | 3/2008 | Spindler et al. |
| 2008/0115729 | A1 | 5/2008 | Oda et al. |
| 2008/0126741 | A1 | 5/2008 | Triplett |
| 2008/0131587 | A1 | 6/2008 | Boroson et al. |
| 2008/0176414 | A1 * | 7/2008 | Im ............................ 438/795 |
| 2008/0286461 | A1 | 11/2008 | Noguchi et al. |
| 2008/0298947 | A1 | 12/2008 | Yeo et al. |
| 2009/0017192 | A1 | 1/2009 | Matsuura |
| 2009/0153033 | A1 | 6/2009 | Lee et al. |
| 2009/0169868 | A1 * | 7/2009 | Haglund et al. ............ 428/327 |
| 2009/0200158 | A1 * | 8/2009 | Ehiasarian ............ 204/192.12 |
| 2009/0229524 | A1 | 9/2009 | Kim et al. |
| 2009/0232976 | A1 | 9/2009 | Yoon et al. |
| 2009/0304924 | A1 | 12/2009 | Gadgil |
| 2009/0308317 | A1 | 12/2009 | Sone et al. |
| 2009/0315456 | A1 | 12/2009 | Furukawa et al. |
| 2010/0130020 | A1 | 5/2010 | Kim et al. |
| 2010/0156279 | A1 | 6/2010 | Tamura et al. |
| 2010/0255208 | A1 * | 10/2010 | Hara et al. ............ 427/420 |
| 2011/0042659 | A1 * | 2/2011 | Kim et al. ............ 257/40 |
| 2011/0052791 | A1 | 3/2011 | Jo et al. |
| 2011/0241438 | A1 | 10/2011 | Kim et al. |
| 2012/0214263 | A1 | 8/2012 | Yamazaki et al. |

FOREIGN PATENT DOCUMENTS

| | | |
|---|---|---|
| CN | 1704501 | 12/2005 |
| CN | 1841696 | 10/2006 |
| CN | 102005541 | 8/2013 |
| EP | 1 413 644 A2 | 4/2004 |
| EP | 1 418 250 A2 | 5/2004 |
| EP | 1 518 940 A1 | 3/2005 |
| JP | 04-272170 | 9/1992 |
| JP | 1993-022405 | 3/1993 |
| JP | 10-120171 | 5/1998 |
| JP | 2000-068054 | 3/2000 |
| JP | 2001-028325 | 1/2001 |
| JP | 2001-052862 | 2/2001 |
| JP | 2001-093667 | 4/2001 |
| JP | 2002-175878 | 6/2002 |
| JP | 2003-003250 | 1/2003 |
| JP | 2003-077662 | 3/2003 |
| JP | 2003-157973 | 5/2003 |
| JP | 2003-297562 | 10/2003 |
| JP | 2003-347394 | 12/2003 |
| JP | 2004-043898 | 2/2004 |
| JP | 2004-103269 | 4/2004 |
| JP | 2004-103341 | 4/2004 |
| JP | 2004-199919 | 7/2004 |
| JP | 2004-342455 | 12/2004 |
| JP | 2005-044592 | 2/2005 |
| JP | 2005-213616 | 8/2005 |
| JP | 2005-235568 | 9/2005 |
| JP | 2005-293968 | 10/2005 |
| JP | 2005-296737 | 10/2005 |
| JP | 2006-275433 | 10/2006 |
| JP | 2006-307247 | 11/2006 |
| JP | 2007-047293 | 2/2007 |
| JP | 2008-019477 | 1/2008 |
| JP | 2008-121098 | 5/2008 |
| JP | 2009-019243 | 1/2009 |
| JP | 2009-87910 | 4/2009 |
| JP | 2009-117231 | 5/2009 |
| JP | 2010-159167 | 7/2010 |
| KR | 10-0151312 B1 | 6/1998 |
| KR | 10-0257219 B1 | 2/2000 |
| KR | 10-2000-0019254 | 4/2000 |
| KR | 10-2000-0023929 | 5/2000 |
| KR | 10-2001-0059939 | 7/2001 |
| KR | 10-2002-0000201 | 1/2002 |
| KR | 10-2002-0050922 | 6/2002 |
| KR | 10-2002-0088662 A | 11/2002 |
| KR | 10-2002-0090934 | 12/2002 |
| KR | 10-2003-0043012 | 6/2003 |
| KR | 10-0405080 B1 | 11/2003 |
| KR | 10-0406059 | 11/2003 |
| KR | 10-2003-0091947 | 12/2003 |
| KR | 10-2003-0093959 | 12/2003 |
| KR | 10-2004-0034537 | 4/2004 |
| KR | 10-0430336 A1 | 5/2004 |
| KR | 10-2004-0050045 | 6/2004 |
| KR | 10-2004-0069281 | 8/2004 |
| KR | 10-2004-0084747 | 10/2004 |
| KR | 10-0463212 B1 | 12/2004 |
| KR | 10-2005-0024324 | 3/2005 |
| KR | 10-0520159 B1 | 10/2005 |
| KR | 10-2006-0008602 | 1/2006 |
| KR | 10-2006-0018745 | 3/2006 |
| KR | 10-2006-0073367 | 6/2006 |
| KR | 10-2006-0077887 | 7/2006 |
| KR | 10-2006-0080475 | 7/2006 |
| KR | 10-2006-0080481 | 7/2006 |
| KR | 10-2006-0080482 | 7/2006 |
| KR | 10-2006-0083510 | 7/2006 |
| KR | 10-2006-0104675 | 10/2006 |
| KR | 10-2006-0104677 | 10/2006 |
| KR | 10-2006-0109627 | 10/2006 |
| KR | 10-0646160 B1 | 11/2006 |
| KR | 10-0687007 B1 | 2/2007 |

(56) References Cited

FOREIGN PATENT DOCUMENTS

| | | |
|---|---|---|
| KR | 10-0696547 B1 | 3/2007 |
| KR | 10-0698033 B1 | 3/2007 |
| KR | 10-0700466 B1 | 3/2007 |
| KR | 10-2007-0035796 | 4/2007 |
| KR | 10-0711885 B1 | 4/2007 |
| KR | 10-2007-0050793 | 5/2007 |
| KR | 10-0723627 B1 | 5/2007 |
| KR | 10-2007-0056190 | 6/2007 |
| KR | 10-0726132 B1 | 6/2007 |
| KR | 10-0736218 | 6/2007 |
| KR | 10-0741142 B1 | 7/2007 |
| KR | 10-2007-0078713 | 8/2007 |
| KR | 10-2007-0080635 | 8/2007 |
| KR | 10-2007-0091437 | 9/2007 |
| KR | 10-2007-0101842 | 10/2007 |
| KR | 10-2007-0105595 | 10/2007 |
| KR | 10-0770653 B1 | 10/2007 |
| KR | 10-2008-0001184 | 1/2008 |
| KR | 10-2008-0007896 | 1/2008 |
| KR | 10-2008-0009285 | 1/2008 |
| KR | 10-0797787 B1 | 1/2008 |
| KR | 10-0800125 B1 | 1/2008 |
| KR | 10-0823508 B1 | 4/2008 |
| KR | 10-2008-0044239 | 5/2008 |
| KR | 10-2008-0046761 | 5/2008 |
| KR | 10-0827760 B1 | 5/2008 |
| KR | 10-2008-0057159 | 6/2008 |
| KR | 10-0839380 B1 | 6/2008 |
| KR | 10-2008-0060400 | 7/2008 |
| KR | 10-2008-0061132 | 7/2008 |
| KR | 10-2008-0062212 | 7/2008 |
| KR | 10-2008-0076574 | 8/2008 |
| KR | 10-2008-0104479 | 12/2008 |
| KR | 10-2008-0104695 | 12/2008 |
| KR | 10-2009-0038733 | 4/2009 |
| KR | 10-0899279 B1 | 5/2009 |
| KR | 10-2009-0066996 | 6/2009 |
| KR | 10-2009-0075887 | 7/2009 |
| KR | 10-2009-0079765 A | 7/2009 |
| KR | 10-2009-0081717 | 7/2009 |
| KR | 10-2009-0094911 | 9/2009 |
| KR | 10-2009-0097453 | 9/2009 |
| KR | 10-2010-0038088 | 4/2010 |
| KR | 10-2010-0044606 | 4/2010 |
| KR | 10-2010-0128589 | 12/2010 |
| KR | 10-101-7654 B1 | 2/2011 |
| KR | 10-2011-0110525 | 10/2011 |
| WO | WO 03/043067 A1 | 5/2003 |
| WO | WO 2004/016406 | 2/2004 |

OTHER PUBLICATIONS

KIPO Notice of Allowance dated Apr. 26, 2012, for Korean Patent application 10-2010-0066991, (5 pages).
KIPO Registration Determination Certificate dated Jul. 2, 2012, for Korean Patent application 10-2010-0011480, (5 pages).
KIPO Registration Determination Certificate dated Jul. 2, 2012, for Korean priority Patent application 10-2010-0011481, (5 pages).
U.S. Office action dated Oct. 3, 2012, for cross reference U.S. Appl. No. 12/869,830, (28 pages).
SIPO Office Action dated Oct. 9, 2012 for Chinese Patent Application No. 201010266406.6 (6 pages).
U.S. Office Action dated Jun. 17, 2013 for cross-reference U.S. Appl. No. 13/180,454 (23 pages).
U.S. Office Action dated Aug. 2, 2013 for cross-reference U.S. Appl. No. 12/868,099 (32 pages).
U.S. Office Action dated Sep. 25, 2013 for cross-reference U.S. Appl. No. 13/031,756 (34 pages).
U.S. Office Action dated Nov. 20, 2013 for cross-reference U.S. Appl. No. 12/868,099 (14 pages).
European Search Report dated May 27, 2011, for European Patent application 10251514.5, 11 pages.
KIPO Office action dated Feb. 6, 2012, for Korean Patent application 10-2010-0011481, 7 pages.
KIPO Office action dated Feb. 6, 2012, for Korean Patent application 10-2010-0011480, 8 pages.
U.S. Office action dated Jun. 21, 2011, for cross-reference U.S. Appl. No. 12/862,153, 21 pages.
Patent Abstracts of Japan, and English machine translation of Japanese Publication 2001-052862, 20 pages.
Patent Abstracts of Japan, and English machine translation of Japanese Publication 2003-003250, 25 pages.
Korean Patent Abstracts, Publication No. 1020020086047, dated Nov. 18, 2002, for corresponding Korean Patent 10-0405080.
Korean Patent Abstracts, Publication No. 1020020088662, dated Nov. 29, 2002, for corresponding Korean Patent 10-0463212.
Korean Patent Abstracts, Publication No. 1020050045619, dated May 17, 2005, for corresponding Korean Patent 10-0520159.
Korean Patent Abstracts, Publication No. 1020040062203, dated Jul. 7, 2002, for corresponding Korean Patent 10-0646160.
Korean Patent Abstracts, Publication No. 1020060101987, dated Sep. 27, 2006, for corresponding Korean Patent 10-0687007.
Korean Patent Abstracts, Publication No. 1020020056238, dated Jul. 10, 2002, for corresponding Korean Patent 10-0698033.
Korean Patent Abstracts, Publication No. 1020050078637, dated Aug. 5, 2005, for corresponding Korean Patent 10-0700466.
Korean Patent Abstracts, Publication No. 1020070025164, dated Mar. 8, 2007, for corresponding Korean Patent 10-0711885.
Korean Patent Abstracts, Publication No. 1020020034272, dated May 9, 2002, for corresponding Korean Patent 10-0726132.
Korean Patent Abstracts, Publication No. 10-2007-0056241, dated Jun. 4, 2007, corresponding to Korean Patent 10-0741142 B1.
Korean Patent Abstracts, Publication No. 1020060126267, dated Dec. 6, 2006, for corresponding Korean Patent 10-0797787.
English Abstract, Publication No. 1020080002189, dated Jan. 4, 2008, for corresponding Korean Patent 10-0800125.
Korean Patent Abstracts, Publication No. 1020010062735, dated Jul. 7, 2001, for corresponding Korean Patent 10-0827760.
Korean Patent Abstracts, Publication No. 1020080038650, dated May 7, 2008, for corresponding Korean Patent 10-0839380.
Korean Patent Abstracts, Publication No. 10-2008-0070302, dated Jul. 30, 2008, corresponding to Korean Patent 10-0899279 B1.

* cited by examiner

THIN FILM DEPOSITION APPARATUS, METHOD OF MANUFACTURING ORGANIC LIGHT-EMITTING DISPLAY DEVICE BY USING THE APPARATUS, AND ORGANIC LIGHT-EMITTING DISPLAY DEVICE MANUFACTURED BY USING THE METHOD

CROSS-REFERENCE TO RELATED PATENT APPLICATION

This application claims the benefit of Korean Patent Application No. 10-2010-0091091, filed on Sep. 16, 2010 in the Korean Intellectual Property Office, the disclosure of which is incorporated herein in its entirety by reference.

BACKGROUND

1. Field

Aspects of embodiments of the present invention relate to a thin film deposition apparatus, a method of manufacturing an organic light-emitting display device by using the thin film deposition apparatus, and an organic light-emitting display device manufactured by using the method.

2. Description of the Related Art

Organic light-emitting display devices have a larger viewing angle, better contrast characteristics, and faster response speeds than other display devices, and thus have drawn attention as next-generation display devices.

An organic light-emitting display device includes intermediate layers, including an emission layer disposed between a first electrode and a second electrode that are arranged opposite to each other. The electrodes and the intermediate layers may be formed via various methods, one of which is a deposition method. When an organic light-emitting display device is manufactured by using the deposition method, a fine metal mask (FMM) having the same pattern as a thin film to be formed is disposed to closely contact a substrate, and a thin film material is deposited over the FMM in order to form the thin film having a desired pattern.

SUMMARY

According to aspects of the present invention, a thin film deposition apparatus is suitable for manufacturing large-size display devices on a mass scale and can be used for high-definition patterning. According to further aspects of the present invention, a method of manufacturing an organic light-emitting display device by using the thin film deposition apparatus, and an organic light-emitting display device manufactured by using the method are also provided.

According to one embodiment of the present invention, a thin film deposition apparatus for forming a thin film on a substrate includes: a first chamber in a vacuum state; first and second stages arranged in parallel in the first chamber wherein the substrate is fixable to at least one of the first and second stages; a mask contactable with the substrate; and a first deposition source and a second deposition source that are movable relative to the first and second stages and are configured to discharge a deposition material onto the substrate.

The first and second deposition sources may be movable at a same rate along a same trajectory.

The second deposition source may be movable along a trajectory of the first deposition source.

The first and second deposition sources may continuously perform depositions while moving along a closed-loop in the first chamber.

The mask may include a fine metal mask (FMM).

While the deposition material is discharged onto the substrate on one of the first and second stages, another substrate is transferable to the other of the first and second stages and alignable with respect to another mask.

The first deposition source may include a deposition material for forming a red auxiliary layer (R'), and the second deposition source may include a deposition material for forming a red emission layer (R).

The first deposition source may include a deposition material for forming a green auxiliary layer (G'), and the second deposition source may include a deposition material for forming a green emission layer (G).

The thin film deposition apparatus may further include: a second chamber adjacent a side of the first chamber; and a thin film deposition assembly in the second chamber, wherein the thin film deposition assembly includes a deposition source configured to discharge another deposition material; a deposition source nozzle unit at a side of the deposition source and including a plurality of deposition source nozzles arranged in a first direction; a patterning slit sheet arranged opposite to the deposition source nozzle unit and including a plurality of patterning slits arranged in the first direction; and a barrier plate assembly including a plurality of barrier plates arranged between the deposition source nozzle unit and the patterning slit sheet in the first direction and partitioning a space between the deposition source nozzle unit and the patterning slit sheet into a plurality of sub-deposition spaces.

The thin film deposition assembly may be spaced apart from the substrate by a predetermined distance, and at least one of the thin film deposition assembly or the substrate may be movable relative to the other.

The barrier plates may extend in a second direction that is substantially perpendicular to the first direction and partition the space between the deposition source nozzle unit and the patterning slit sheet into the plurality of sub-deposition spaces.

The patterning slit sheet may be smaller than the substrate.

The thin film deposition apparatus may further include a transfer guide unit penetrating the first chamber and second chamber, wherein the substrate movable along the transfer guide unit.

According to another embodiment of the present invention, a method of manufacturing an organic light-emitting display device by using a thin film deposition apparatus includes: transferring a first substrate into a first chamber such that the first substrate is fixed to a first stage and aligned with respect to a first mask; depositing deposition materials discharged from first and second deposition sources on the first substrate while moving the first and second deposition sources relative to the first substrate; transferring a second substrate into the first chamber such that the second substrate is fixed to a second stage and aligned with respect to a second mask while the deposition materials are deposited on the first substrate; and depositing deposition materials discharged from the first and second deposition sources on the second substrate while moving the first and second deposition sources relative to the second substrate.

Depositing the deposition materials on the first substrate and depositing the deposition materials on the second substrate may be performed by sequentially depositing a deposition material for forming a red auxiliary layer and contained in the first deposition source and a deposition material for forming a red emission layer and contained in the second deposition source on the first substrate and the second substrate.

Depositing the deposition material on the first substrate and depositing the deposition material on the second substrate may be performed by sequentially depositing a deposition material for forming a green auxiliary layer and contained in the first deposition source and a deposition material for forming a green emission layer and contained in the second deposition source on the first substrate and the second substrate.

The first and second deposition sources may be moved at a same rate along a same trajectory.

The second deposition source may be moved along a trajectory of the first deposition source.

The first and second deposition sources may be moved along a closed-loop in the first chamber while continuously performing depositions.

The method may further include separating at least one of the first or second substrates having the deposition materials deposited thereon from the first or second mask and transferring the at least one first or second substrate outside of the first chamber.

Transferring the first and second substrates into the first chamber and depositing deposition materials on the first and second substrates may be repeatedly performed.

The method may further include supporting at least one of the first and second substrates by a chuck; spacing the at least one substrate apart from a thin film deposition assembly; and moving at least one of the at least one substrate or the thin film deposition assembly relative to the other while discharging another deposition material on the at least one substrate, wherein the thin film deposition assembly includes: a second chamber adjacent a side of the first chamber; a deposition source in the second chamber and discharging the another deposition material; a deposition source nozzle unit arranged at a side of the deposition source and including a plurality of deposition source nozzles arranged in a first direction; a patterning slit sheet arranged opposite to the deposition source nozzle unit and including a plurality of patterning slits arranged in the first direction; and a barrier plate assembly including a plurality of barrier plates arranged between the deposition source nozzle unit and the patterning slit sheet in the first direction and partitioning a space between the deposition source nozzle unit and the patterning slit sheet into a plurality of sub-deposition spaces.

According to another embodiment of the present invention, an organic light-emitting display device is manufactured using the method.

BRIEF DESCRIPTION OF THE DRAWINGS

The above and other features and advantages of the present invention will become more apparent by describing in detail some exemplary embodiments thereof with reference to the attached drawings in which.

DETAILED DESCRIPTION

Some exemplary embodiments will now be described with reference to the accompanying drawings, wherein like reference numerals refer to the like elements throughout. Embodiments of the present invention may be embodied in different forms and should not be construed as limited to the exemplary embodiments illustrated and set forth herein. Rather, these exemplary embodiments are provided by way of example for understanding of the invention and to convey the scope of the invention to those skilled in the art.

Figure 1:
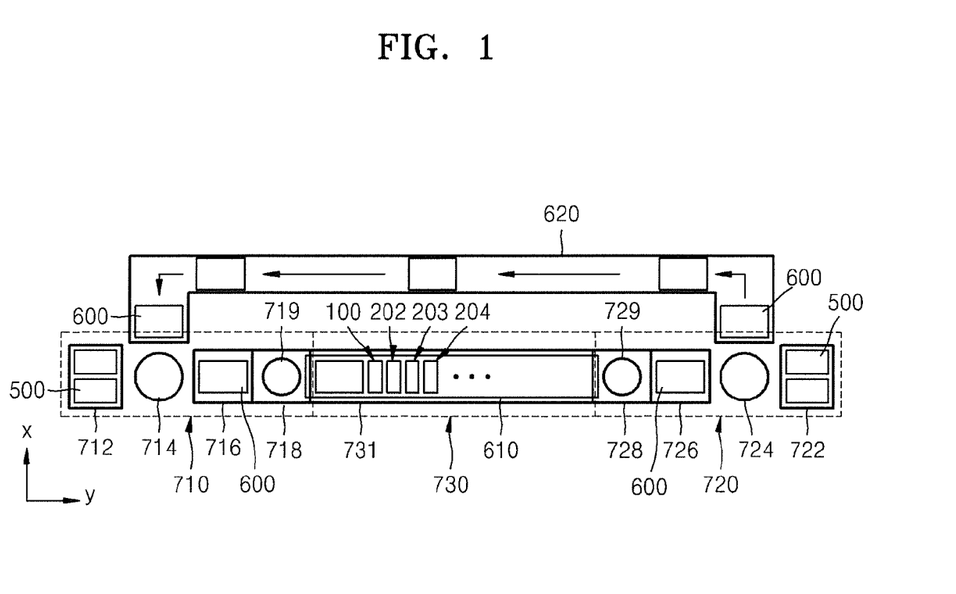
FIG. 1 is a schematic view of a thin film deposition apparatus according to an embodiment of the present invention.
Figure 2:
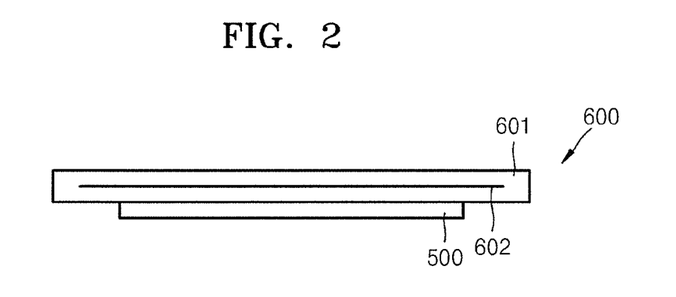
FIG. 2 is a cross-sectional view of an electrostatic chuck of a thin film deposition apparatus according to an embodiment of the present invention.

FIG. 1 is a schematic view of a thin film deposition apparatus according to an embodiment of the present invention. FIG. 2 is a cross-sectional view of an electrostatic chuck of the thin film deposition apparatus FIG. 1 according to an embodiment of the present invention.

Referring to FIG. 1, the thin film deposition apparatus according to one embodiment includes a loading unit 710, a deposition unit 730, an unloading unit 720, a first conveyer unit 610, and a second conveyer unit 620.

The loading unit 710, in one embodiment, includes a first rack 712, a transport robot 714, a transport chamber 716, and a first inversion chamber 718.

A plurality of substrates 500 onto which a deposition material is not applied are stacked on the first rack 712. The transport robot 714 picks up one of the substrates 500 from the first rack 712, disposes it on an electrostatic chuck 600 transferred by the second conveyor unit 620, and moves the electrostatic chuck 600 on which the substrate 500 is disposed into the transport chamber 716.

The first inversion chamber 718 is disposed adjacent to the transport chamber 716. The first inversion chamber 718 includes a first inversion robot 719 that inverts the electrostatic chuck 600 and then loads it into the first conveyer unit 610 of the deposition unit 730.

Referring to FIG. 2, the electrostatic chuck 600 may include an electrode 602 embedded in a main body 601 formed of ceramic, for example, wherein power is supplied to the electrode 602. The electrostatic chuck 600 may fix the substrate 500 on a bottom surface of the main body 601 as a high voltage is applied to the electrode 602.

Referring to FIG. 1, the transport robot 714 places one of the substrates 500 on the surface of the electrostatic chuck 600, and the electrostatic chuck 600 on which the substrate 500 is disposed is loaded into the transport chamber 716. The first inversion robot 719 inverts the electrostatic chuck 600 so that the substrate 500 is turned upside down in the deposition unit 730.

The unloading unit 720 is configured to operate in an opposite manner to the loading unit 710 described above. Specifically, a second inversion robot 729 in a second inversion chamber 728 inverts the electrostatic chuck 600, which has passed through the deposition unit 730 where the substrate 500 is disposed on the electrostatic chuck 600, and then moves the electrostatic chuck 600 on which the substrate 500 is disposed into an ejection chamber 726. Then, an ejection robot 724 removes the electrostatic chuck 600 on which the substrate 500 is disposed from the ejection chamber 726, separates the substrate 500 from the electrostatic chuck 600, and then loads the substrate 500 into a second rack 722. The electrostatic chuck 600 separated from the substrate 500 is returned back into the loading unit 710 via the second conveyer unit 620.

However, embodiments of the present invention are not limited to the above description. For example, in another embodiment, when disposing the substrate 500 on the electrostatic chuck 600, the substrate 500 may be fixed onto a bottom surface of the electrostatic chuck 600 and then moved into the deposition unit 730. In this case, for example, the first inversion chamber 718 and the first inversion robot 719, and the second inversion chamber 728 and the second inversion robot 729 are not required.

The deposition unit 730 may include at least one deposition chamber. A chamber 731 is maintained in a vacuum state during a deposition process. As illustrated in FIG. 1, in one embodiment, the deposition unit 730 includes the single chamber 731. In one embodiment, first to fourth thin film deposition assemblies 100, 202, 203, and 204 may be disposed in the chamber 731. Although the single chamber 731 is shown in FIG. 1, in another embodiment, the deposition unit 730 may include a plurality of chambers (e.g., chambers 731a, 731b, 731c, and 731d described later in detail with reference to FIGS. 6 and 7). Although FIG. 1 illustrates that a total of four thin film deposition assemblies, i.e., the first to fourth thin film deposition assemblies 100, 202, 203, and 204, are installed in the chamber 731, the total number of thin film deposition assemblies that may be installed in the chamber 731 may vary according to a deposition material and deposition conditions. This will also be described later in detail with reference to FIGS. 6 and 7. In addition, components of each of the thin film deposition assemblies will be described with reference to FIGS. 3 to 5.

In the embodiment illustrated in FIG. 1, the electrostatic chuck 600 on which the substrate 500 is disposed may be moved at least to the deposition unit 730 or may be moved sequentially to the loading unit 710, the deposition unit 730, and the unloading unit 720, by the first conveyor unit 610. The electrostatic chuck 600 that is separated from the substrate 500 in the unloading unit 720 is moved back to the loading unit 710 by the second conveyor unit 620.

Figure 3:
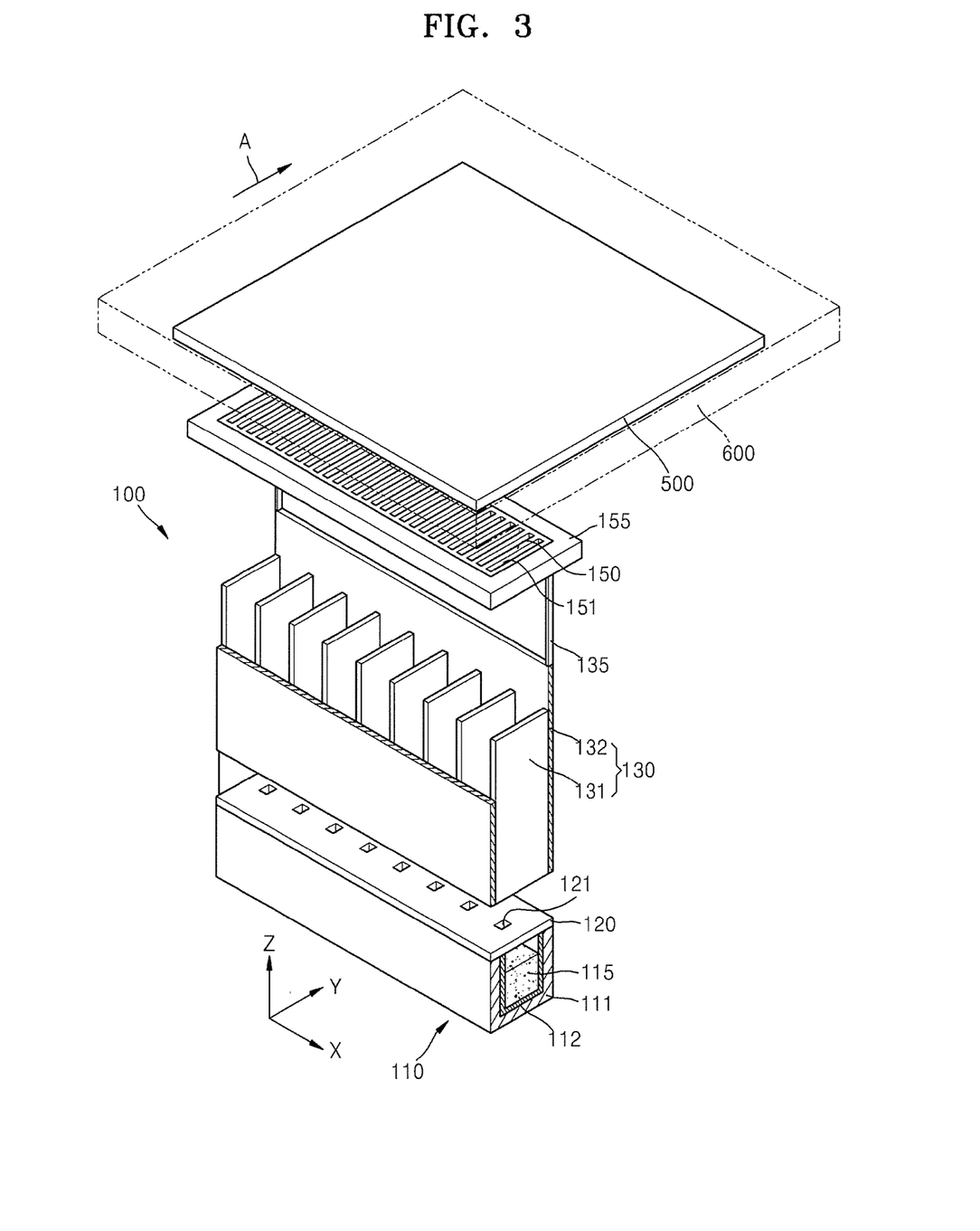
FIG. 3 is a schematic perspective view of a thin film deposition assembly of the thin film deposition apparatus of FIG. 1.

An embodiment of a thin film deposition assembly, namely, the first thin film deposition assembly 100 of the thin film deposition apparatus described above, will now be described. FIG. 3 is a schematic perspective view of the thin film deposition assembly 100 of the thin film deposition apparatus of FIG. 1, FIG. 4 is a cross-sectional side view of the thin film deposition assembly 100 illustrated in FIG. 3, and FIG. 5 is a cross-sectional plan view of the thin film deposition assembly 100 illustrated in FIG. 3.

Figure 4:
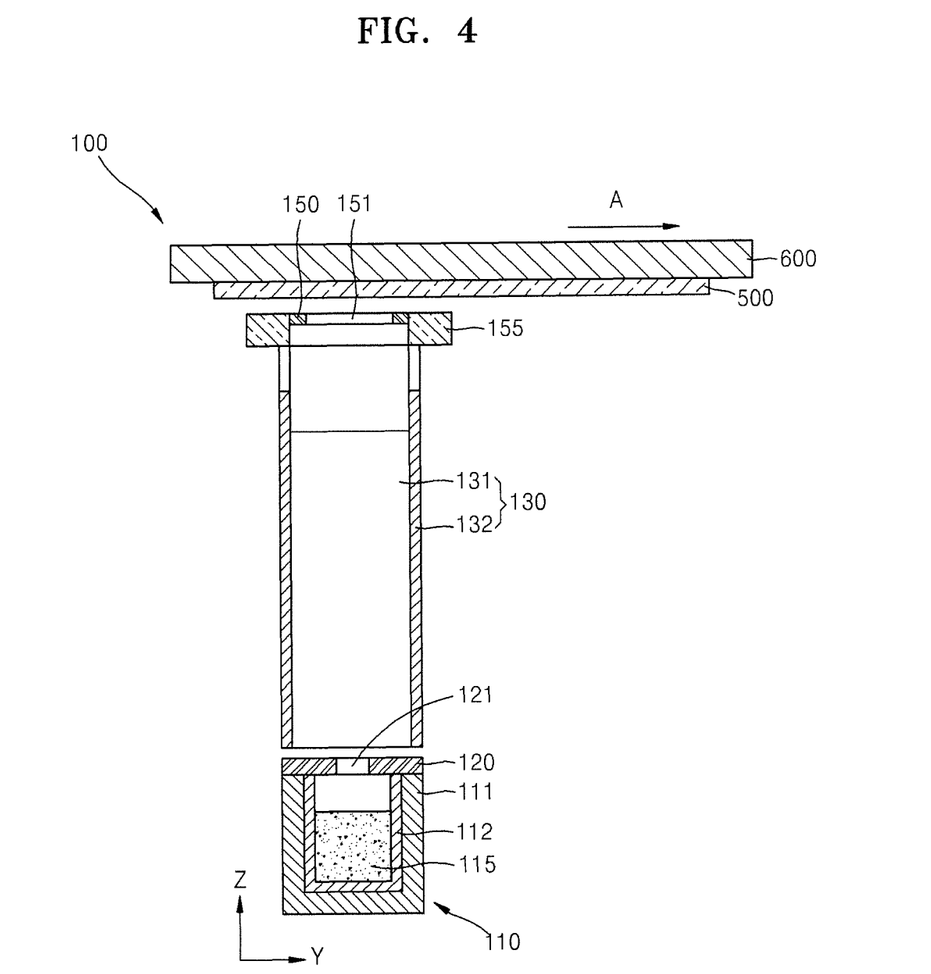
FIG. 4 is a schematic sectional side view of the thin film deposition assembly of FIG. 3.
Figure 5:
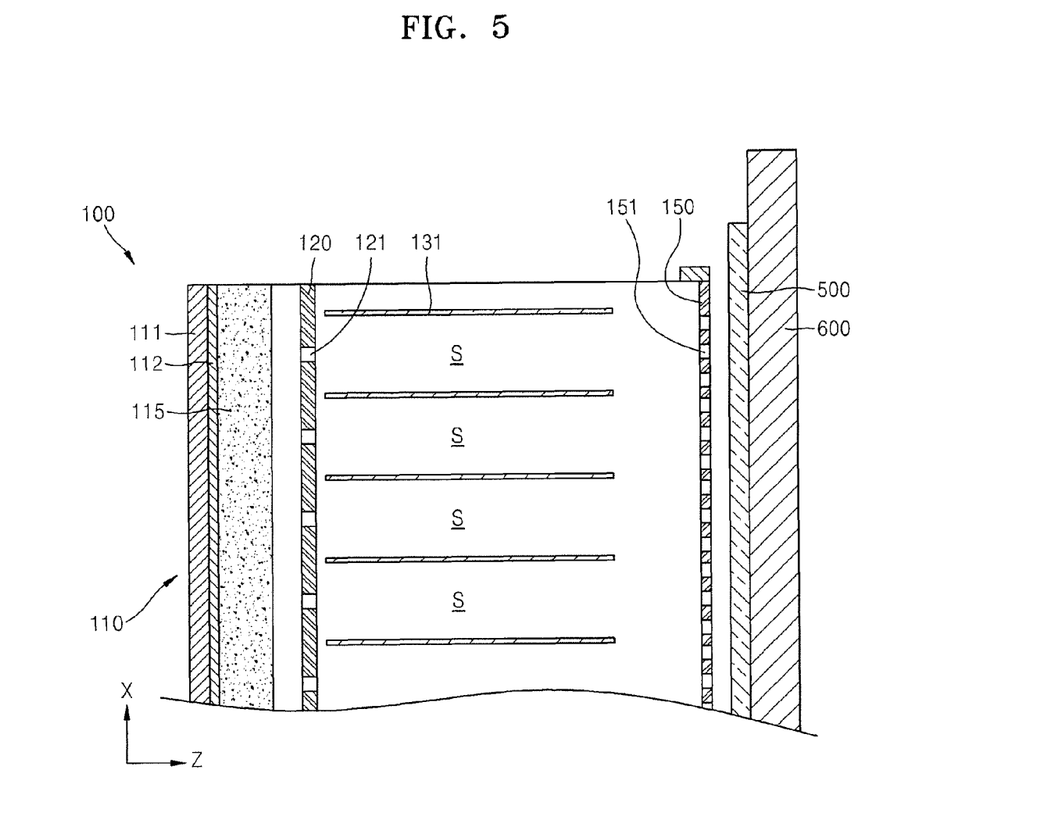
FIG. 5 is a schematic plan view of the thin film deposition assembly of FIG. 3.

Referring to FIGS. 3, 4, and 5, the thin film deposition assembly 100 according to one embodiment of the present invention includes a deposition source 110, a deposition source nozzle unit 120, a barrier plate assembly 130, and a patterning slit sheet 150.

Although a chamber is not illustrated in FIGS. 3 through 5 for convenience of explanation, all the components of the thin film deposition assembly 100 may be disposed within a chamber that is maintained at an appropriate degree of vacuum. The chamber is maintained at an appropriate vacuum in order to allow a deposition material to move in a substantially straight line through the thin film deposition assembly 100.

In particular, in order to deposit a deposition material 115 that is emitted from the deposition source 110 and is discharged through the deposition source nozzle unit 120 and the patterning slit sheet 150 onto a substrate 500 in a desired pattern, the chamber (731 of FIG. 1) is maintained in a high-vacuum state. In addition, the temperatures of the barrier plate assembly 130 and the patterning slit sheet 150 should be sufficiently lower than the temperature of the deposition source 110 to maintain a space between the deposition source nozzle unit 120 and the patterning slit sheet 150 in a high-vacuum state. In one embodiment, the temperatures of the barrier plate assembly 130 and the patterning slit sheet 150 may be about 100° C. or less. This is because the deposition material 115 that has collided with the barrier plate assembly 130 may not vaporize again when the temperatures of the barrier plate assembly 130 and the patterning slit sheet 150 are sufficiently lower than the temperature of the deposition source 110. In addition, thermal expansion of the patterning slit sheet 150 may be minimized or reduced when the temperature of the patterning slit sheet 150 is sufficiently lower than the temperature of the deposition source 110. The barrier plate assembly 130 faces the deposition source 110 which is at a high temperature. In addition, in one embodiment, the temperature of a portion of the barrier plate assembly 130 close to the deposition source 110 rises to a maximum of about 167° C., and thus a partial-cooling apparatus (not shown) may be further included if needed.

In the chamber 731 of FIG. 1, in which the thin film deposition assembly 100 is disposed, the substrate 500, which constitutes a deposition target on which the deposition material 115 is to be deposited, is transferred by the electrostatic chuck 600. The substrate 500 may be a substrate for flat panel displays. A large substrate, such as a mother glass, for manufacturing a plurality of flat panel displays, may be used as the substrate 500. Other substrates may also be employed.

In one embodiment, the substrate 500 or the thin film deposition assembly 100 may be moved relative to the other. For example, as illustrated in FIG. 4, the substrate 500 may be moved in a direction of an arrow A, relative to the thin film deposition assembly 100.

In a conventional deposition method using a fine metal mask (FMM), the size of the FMM has to be greater than or equal to the size of a substrate. Thus, the size of the FMM has to be increased the larger the substrate is. However, it is neither straightforward to manufacture a large FMM nor to extend an FMM to be accurately aligned with a pattern.

In the thin film deposition assembly 100 according to an embodiment of the present invention, deposition may be performed while the thin film deposition assembly 100 or the substrate 500 is moved relative to the other. In other words, deposition may be continuously performed while the substrate 500, which is disposed facing the thin film deposition assembly 100, is moved in a Y-axis direction. In other words, deposition is performed in a scanning manner while the substrate 500 is moved in the direction of the arrow A in FIG. 4. Although the substrate 500 is illustrated as being moved in the Y-axis direction (731 of FIG. 1) when deposition is performed, embodiments of the present invention are not limited thereto. For example, in another embodiment, deposition may be performed while the thin film deposition assembly 100 is moved in the Y-axis direction, while the substrate 500 is fixed.

Thus, in the thin film deposition assembly 100 according to embodiments of the present invention, the patterning slit sheet 150 may be significantly smaller than a FMM used in a conventional deposition method. In other words, in the thin film deposition assembly 100, deposition is continuously performed, i.e., in a scanning manner while the substrate 500 is moved in the Y-axis direction. Thus, a length of the patterning slit sheet 150 in the Y-axis direction may be significantly less than a length of the substrate 500 and a width of the patterning slit sheet 150 in the X-axis direction and a width of the substrate 500 in the X-axis direction may be substantially equal to each other. In another embodiment, the width of the patterning slit sheet 150 in the X-axis direction may be less than the width of the substrate 500 in the X-axis direction, and deposition may be performed on the entire substrate 500 in a scanning manner while the substrate 500 or the thin film deposition assembly 100 is moved relative to the other (e.g., in the x-axis direction).

As described above, since the patterning slit sheet 150 may be formed to be significantly smaller than a FMM used in a conventional deposition method, it is relatively easy to manufacture the patterning slit sheet 150 used in the present invention. In other words, using the patterning slit sheet 150, which is smaller than a FMM used in a conventional deposition method, is more convenient in all processes, including etching and other subsequent processes, such as precise extension, welding, moving, and cleaning processes, compared to the conventional deposition method using the larger FMM. This is more advantageous for a relatively large display device.

In order to perform deposition while the thin film deposition assembly 100 or the substrate 500 is moved relative to the other as described above, the thin film deposition assembly 100 and the substrate 500 may be separated from each other by a predetermined distance, as will be described later in detail.

The deposition source 110 that contains and heats the deposition material 115 is disposed in a side of the chamber opposite to a side in which the substrate 500 is disposed.

The deposition source 110, in one embodiment, includes a crucible 112 that is filled with the deposition material 115, and a cooling block 111 surrounding the crucible 112. The cooling block 111 prevents or reduces radiation of heat from the crucible 112 to the outside, i.e., into the chamber 731. The cooling block 111 may include a heater (not shown) that heats the crucible 112.

The deposition source nozzle unit 120 is disposed at a side of the deposition source 110, and in particular, at the side of the deposition source 110 facing the substrate 500. The deposition source nozzle unit 120 includes a plurality of deposition source nozzles 121 arranged at equal intervals, for example, in the X-axis direction. The deposition material 115 that is vaporized in the deposition source 110 passes through the deposition source nozzles 121 of the deposition source nozzle unit 120 toward the substrate 500, which constitutes a target on which the deposition material 115 is to be deposited.

The barrier plate assembly 130 is disposed at a side of the deposition source nozzle unit 120. The barrier plate assembly 130 includes a plurality of barrier plates 131, and a barrier plate frame 132 that covers sides of the barrier plates 131. The plurality of barrier plates 131 may be arranged parallel to each other at equal intervals in the X-axis direction. In addition, each of the barrier plates 131 may be arranged parallel to a Y-Z plane in FIG. 4, and may have a rectangular shape. The plurality of barrier plates 131 arranged as described above partition the space between the deposition source nozzle unit 120 and the patterning slit sheet 150 into a plurality of sub-deposition spaces S (see FIG. 5). In the thin film deposition assembly 100 according to an embodiment of the present invention, as illustrated in FIG. 5, the deposition space is divided by the barrier plates 131 into the sub-deposition spaces S that respectively correspond to the deposition source nozzles 121 through which the deposition material 115 is discharged.

The barrier plates 131 may be respectively disposed between adjacent deposition source nozzles 121. In other words, each of the deposition source nozzles 121 may be disposed between two adjacent barrier plates 131. The deposition source nozzles 121 may be respectively located at the midpoint between two adjacent barrier plates 131. However, embodiments of the present invention are not limited to this structure. For example, in another embodiment, a plurality of deposition source nozzles 121 may be disposed between two adjacent barrier plates 131. In this case, the deposition source nozzles 121 may be also respectively located at the midpoint between two adjacent barrier plates 131.

As described above, since the barrier plates 131 partition the space between the deposition source nozzle unit 120 and the patterning slit sheet 150 into the plurality of sub-deposition spaces S, the deposition material 115 discharged through each of the deposition source nozzles 121 is not mixed with the deposition material 115 discharged through the other deposition source nozzles 121, and passes through patterning slits 151 of the patterning slit sheet 150 so as to be deposited on the substrate 500. In other words, the barrier plates 131 guide the deposition material 115, which is discharged through the deposition source nozzles 121, to move straight, i.e. to not flow in the X-axis direction.

As described above, the deposition material 115 is forced to move straight by installing the barrier plates 131, so that a smaller shadow zone may be formed on the substrate 500, compared to a case where no barrier plates are installed. Thus, the thin film deposition assembly 100 and the substrate 500 can be separated from each other by a predetermined distance, as will be described later in detail.

The barrier plate frame 132, which is formed on sides of the barrier plates 131, maintains the positions of the barrier plates 131, and guides the deposition material 115, which is discharged through the deposition source nozzles 121, not to flow in the Y-axis direction.

The deposition source nozzle unit 120 and the barrier plate assembly 130 may be separated from each other by a predetermined distance. This may prevent or substantially prevent heat radiated from the deposition source unit 110 from being conducted to the barrier plate assembly 130. However, embodiments of the present invention are not limited thereto. For example, in another embodiment, an appropriate heat insulator (not shown) may be disposed between the deposition source nozzle unit 120 and the barrier plate assembly 130. In this case, the deposition source nozzle unit 120 and the barrier plate assembly 130 may be bound together with the heat insulator the rebetween.

In addition, the barrier plate assembly 130 may be constructed to be detachable from the thin film deposition assembly 100. In the thin film deposition assembly 100 of the thin film deposition apparatus according to an embodiment of the present invention, the deposition space is enclosed by using the barrier plate assembly 130, so that the deposition material 115 that remains undeposited is mostly deposited within the barrier plate assembly 130. Thus, since the barrier plate assembly 130 is constructed to be detachable from the thin film deposition assembly 100, when a large amount of the deposition material 115 lies in the barrier plate assembly 130 after a long deposition process, the barrier plate assembly 130 may be detached from the thin film deposition assembly 100 and then placed in a separate deposition material recycling apparatus in order to recover the deposition material 115. Due to the structure of the thin film deposition assembly 100 according to the above-described embodiment, a reuse rate of the deposition material 115 is increased, so that the deposition efficiency is improved, and thus the manufacturing costs are reduced.

The patterning slit sheet 150 and a frame 155 in which the patterning slit sheet 150 is bound are disposed between the deposition source 110 and the substrate 500. The frame 155 may be formed in a lattice shape, similar to a window frame. The patterning slit sheet 150, in one embodiment, is bound inside the frame 155. The patterning slit sheet 150 includes a plurality of patterning slits 151 arranged, or spaced apart, in the X-axis direction. The patterning slits 151 extend in the Y-axis direction. The deposition material 115 that has been vaporized in the deposition source 110 and passed through the deposition source nozzles 121 passes through the patterning slits 151 toward the substrate 500.

The patterning slit sheet 150 may be formed of a metal thin film. The patterning slit sheet 150, in one embodiment, is fixed to the frame 155 such that a tensile force is exerted thereon. The patterning slits 151 may be formed by etching the patterning slit sheet 150 to form a stripe pattern.

In the thin film deposition assembly 100 according to one embodiment of the present invention, the total number of patterning slits 151 may be greater than the total number of deposition source nozzles 121. In addition, there may be a greater number of patterning slits 151 than deposition source nozzles 121 disposed between two adjacent barrier plates 131. The number of patterning slits 151 may be equal to the number of deposition patterns to be formed on the substrate 500.

In addition, the barrier plate assembly 130 and the patterning slit sheet 150 may be separated or spaced apart from each other by a predetermined distance. Alternatively, the barrier plate assembly 130 and the patterning slit sheet 150 may be connected by a connection member 135. The temperature of the barrier plate assembly 130 may increase to 100° C. or higher due to the deposition source 110 of which a temperature is high. Thus, in one embodiment, in order to prevent or substantially prevent the heat of the barrier plate assembly 130 from being conducted to the patterning slit sheet 150, the barrier plate assembly 130 and the patterning slit sheet 150 are separated from each other by a predetermined distance.

As described above, the thin film deposition assembly 100 according to one embodiment of the present invention performs deposition while being moved relative to the substrate 500. In order to move the thin film deposition assembly 100 relative to the substrate 500, the patterning slit sheet 150 is separated or spaced apart from the substrate 500 by a predetermined distance. In addition, in order to prevent or substantially prevent the formation of a relatively large shadow zone on the substrate 500 when the patterning slit sheet 150 and the substrate 500 are separated from each other, the barrier plates 131 are arranged between the deposition source nozzle unit 120 and the patterning slit sheet 150 to force the deposition material 115 to move in a straight direction. Thus, the size of the shadow zone that may be formed on the substrate 500 is greatly reduced.

In a conventional deposition method using a FMM, deposition is performed with the FMM in close contact with a substrate in order to prevent formation of a shadow zone on the substrate. However, when the FMM is used in close contact with the substrate, the contact may cause defects, such as scratches on patterns formed on the substrate. In addition, in the conventional deposition method, the size of the mask has to be the same as the size of the substrate since the mask cannot be moved relative to the substrate. Thus, the size of the mask has to be increased as display devices become larger. However, it is not easy to manufacture such a large mask.

In the thin film deposition assembly 100 according to an embodiment of the present invention, the patterning slit sheet 150 is disposed to be separated or spaced apart from the substrate 500 by a predetermined distance. This may be facilitated by installing the barrier plates 131 to reduce the size of the shadow zone formed on the substrate 500.

A deposition process performed by forming a patterning slit sheet to be smaller than a substrate using such a thin film deposition assembly and performing a deposition while moving the patterning slit sheet relative to the substrate is defined as small mask scanning (SMS).

An arrangement of a thin film deposition assembly and each deposition source in a chamber of a thin film deposition apparatus, and a deposition process of a thin film will now be described.

Figure 6:
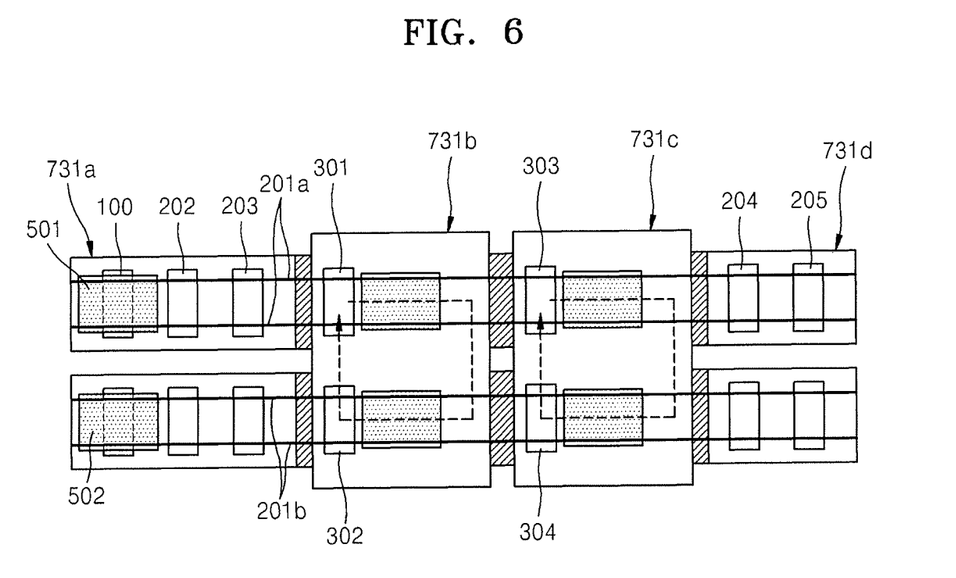
FIG. 6 is a schematic plan view of the thin film deposition apparatus of FIG. 1 illustrating thin film deposition assemblies, deposition sources, and substrates disposed in a chamber of the thin film deposition apparatus.
Figure 7A:
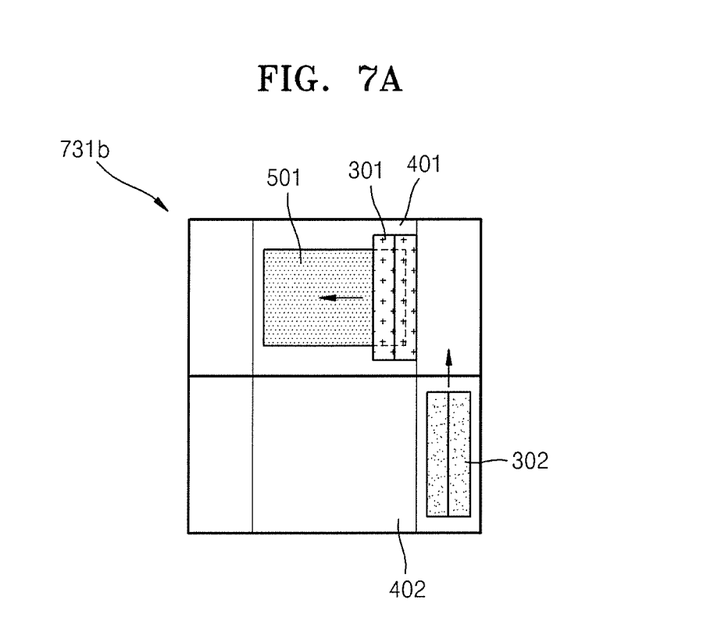
FIGS. 7A to 7D are schematic plan views illustrating deposition of a thin film on a substrate in the chamber of the thin film deposition apparatus shown in FIG. 6.

FIG. 6 is a schematic plan view of the thin film deposition apparatus of FIG. 1 illustrating thin film deposition assemblies, deposition sources, and substrates disposed in a chamber of the thin film deposition apparatus.

Referring to FIG. 6, the chamber 731 of the thin film deposition apparatus according to one embodiment of the present invention includes a first chamber 731a, a second chamber 731b, a third chamber 731c, and a fourth chamber 731d. One or more transfer guide units 201a and 201b are formed to penetrate the first to fourth chambers 731a, 731b, 731c, and 731d, and a deposition is performed while the electrostatic chuck 600 (see FIG. 1) on which the substrate 500 (see FIG. 1) is disposed is transferred along at least one of the transfer guide units 201a and 201b.

In this regard, a deposition using the thin film deposition apparatus according to one embodiment is performed by appropriately disposing thin film deposition assemblies and deposition sources in a chamber and by combining a SMS method and a FMM method. In addition, if a FMM method is used, the deposition is continuously performed without time loss by disposing two stages and two deposition sources in a single chamber.

In particular, in a conventional deposition method using a FMM, a hole injection layer (HIL), a hole transport layer (HTL), a red auxiliary layer (R'), a green auxiliary layer (G'), a red emission layer (EML) (R), a green EML (G), a blue EML (B), and an electron transport layer (ETL) are sequentially stacked. In this case, in order to form the red auxiliary layer (R'), the green auxiliary layer (G'), the red EML (R), the green EML (G), and the blue EML (B), the FMM process has to be performed at least five times. However, in order to perform a single FMM process, a series of processes, including aligning a mask to closely contact a substrate, performing a deposition, and separating the mask from the substrate, are performed. Productivity is reduced if this FMM process is performed more than five times. In addition, while the substrate and the mask are aligned, the deposition process is stopped, thereby reducing productivity.

Meanwhile, if the SMS method using the thin film deposition assembly 100 described with reference to FIGS. 3 to 5 is applied, the substrate and the mask are spaced apart from each other by a predetermined distance, and thus a shadow zone may be formed.

In order to overcome this problem, according to the thin film deposition apparatus according to an embodiment of the present invention, the SMS method is used while common layers not forming shadow zones are formed, and the FMM method is used when the EML and auxiliary layers that should be precisely patterned are formed. In addition, if the FMM method is used, each chamber (e.g., the second chamber 731b and the third chamber 731c) respectively includes two stages and two deposition sources such that the red auxiliary layer (R') and the red EML (R) are deposited in one chamber (e.g., the second chamber 731b), and the green auxiliary layer (G') and the green EML (G) are deposited in another chamber (e.g., the third chamber 731c).

Specifically, the first thin film deposition assembly 100, the second thin film deposition assembly 202, and the third thin film deposition assembly 203 may be disposed in the first chamber 731a, a first deposition source 301 and a second deposition source 302 may be disposed in the second chamber 731b, a third deposition source 303 and a fourth deposition source 304 may be disposed in the third chamber 731c, and the fourth thin film deposition assembly 204 and a fifth thin film deposition assembly 205 may be disposed in the fourth chamber 731d.

In this regard, the deposition sources of each of the thin film deposition assemblies may respectively contain different deposition materials.

For example, the first thin film deposition assembly 100 may contain a deposition material for forming the HIL, the second thin film deposition assembly 202 may contain a deposition material for forming an intermediate layer (IL), and the third thin film deposition assembly 203 may contain a deposition material for forming the HTL. In addition, the first deposition source 301 may contain a deposition material for forming the red auxiliary layer (R'), and the second deposition source 302 may contain a deposition material for forming the red EML (R). In addition, the third deposition source 303 may contain a deposition material for forming the green auxiliary layer (G'), and the fourth deposition source 304 may contain a deposition material for forming the green EML (G). In addition, the fourth thin film deposition assembly 204 may contain a deposition material for forming the blue EML (B), and the fifth thin film deposition assembly 205 may contain a deposition material for forming the ETL.

That is, in one embodiment, each of the first to fifth thin film deposition assemblies 100, 202, 203, 204, and 205 contains a deposition material for forming the common layers (HIL, IL, HTL, B, and ETL), and each of the first to fourth deposition sources 301, 302, 303, and 304 contains a deposition material for forming the pattern layers (R', R, G', and G). In addition, in one embodiment, the SMS method is applied to the first chamber 731a and the fourth chamber 731d including the first to fifth thin film deposition assemblies 100, 202, 203, 204, and 205, and the FMM method is applied to the second chamber 731b and the third chamber 731c including the first to fourth deposition sources 301, 302, 303, and 304.

Meanwhile, in one embodiment, the substrates are transferred along the transfer guide units 201a and 201b formed to penetrate the chambers 731a, 731b, 731c, and 731d. In this regard, each of the transfer guide units 201a and 201b may be a pair of parallel guide rails. In other words, a first substrate 501 is deposited while being transferred through the first to fourth chambers 731a, 731b, 731c, and 731d along the first transfer guide unit 201a, and a second substrate 502 is deposited while being transferred through the first to fourth chambers 731a, 731b, 731c, and 731d via the second transfer guide unit 201b.

In one embodiment, in the first chamber 731a and the fourth chamber 731d, i.e., the chambers in which the common layers are deposited, the SMS method is used. In other words, while first and second substrates 501 and 502 are transferred along the transfer guide units 201a and 201b, deposition materials that are discharged from each of the first to fifth thin film deposition assemblies 100, 202, 203, 204, and 205 are deposited on the first and second substrates 501 and 502.

Meanwhile, in the second chamber 731b and the third chamber 731c, i.e., the chambers in which the pattern layers are deposited, the FMM method is used. In other words, the first and second substrates 501 and 502 are deposited while the first and second substrates 501 and 502 are fixed to the stages and the first to fourth deposition sources 301, 302, 303, and 304 are transferred relative to the first and second substrates 501 and 502. In this regard, the first to fourth deposition sources 301, 302, 303, and 304 continuously perform depositions while circulating in the second chamber 731b or the third chamber 731c along a closed-loop.

A thin film deposition process performed in the second chamber 731b, according to an embodiment of the present invention, will now be described in more detail.

FIGS. 7A to 7D are plan views illustrating deposition of a thin film on substrates in the second chamber 731b of FIG. 6.

First, as shown in FIG. 7A, the first substrate 501 is transferred from the first chamber 731a of FIG. 6 to the second chamber 731b of FIG. 6 along the first transfer guide unit 201a to be fixed to a first stage 401. Then, a first FMM (not shown) for patterning the red auxiliary layer (R') and the red EML (R) is aligned on the first substrate 501, and the first substrate 501 is disposed to closely contact the first FMM.

Then, the first deposition source 301 and the second deposition source 302 are moved in a direction of the arrows of FIG. 7A. Accordingly, a deposition material for forming the red auxiliary layer (R') that is vaporized in the first deposition source 301 passing above the first substrate 501 is deposited on the first substrate 501. In this regard, the first deposition source 301 and the second deposition source 302 may be moved along the same trajectory (dashed line of FIG. 6). That is, the second deposition source 302 is moved along the same path as the first deposition source 301.

Figure 7B:
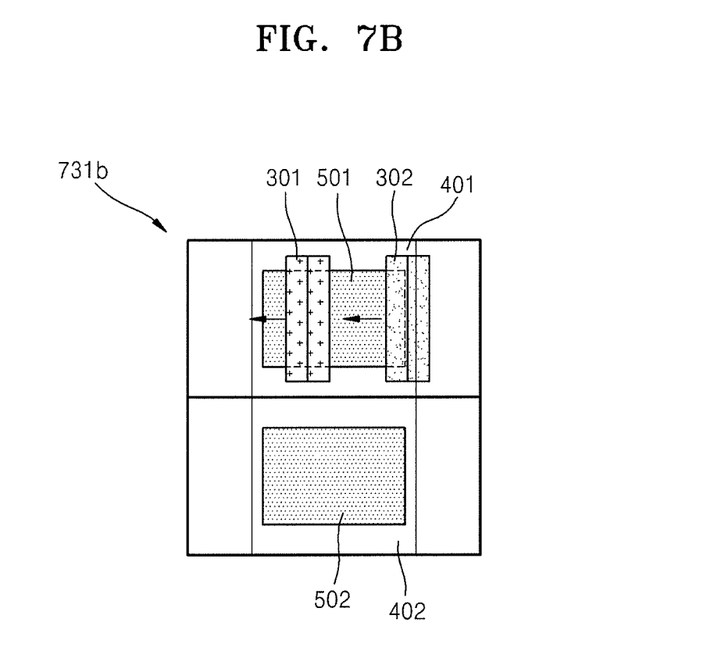

Then, as shown in FIG. 7B, the first deposition source 301 and the second deposition source 302 are respectively moved in a direction of the arrows of FIG. 7B. Accordingly, a deposition material for forming the red auxiliary layer (R') that is vaporized in the first deposition source 301 and a deposition material for forming the red EML (R) that is vaporized in the second deposition source 302 are sequentially deposited on the first substrate 501. As such, while the first deposition source 301 and the second deposition source 302 pass above the first substrate 501, the red auxiliary layer (R') and the red EML (R) are formed on the first substrate 501. Since the red auxiliary layer (R') and the red EML (R) may be sequentially deposited using a single FMM process, the number of FMM processes may be reduced by half.

In this regard, the deposition may be controlled such that the deposition material for forming the red auxiliary layer (R') and the deposition material for forming the red EML (R) are not mixed by adjusting a gap between the first deposition source 301 and the second deposition source 302.

Meanwhile, (e.g., simultaneously to the first substrate 501 being deposited), the second substrate 502 is transferred from the first chamber 731a of FIG. 6 to the second chamber 731b of FIG. 6 along the second transfer guide unit 201b to be fixed to a second stage 402. Then, a second FMM (not shown) for patterning the red auxiliary layer (R') and the red EML (R) is aligned on the second substrate 502, and the second substrate 502 is disposed to closely contact the second FMM.

Figure 7C:
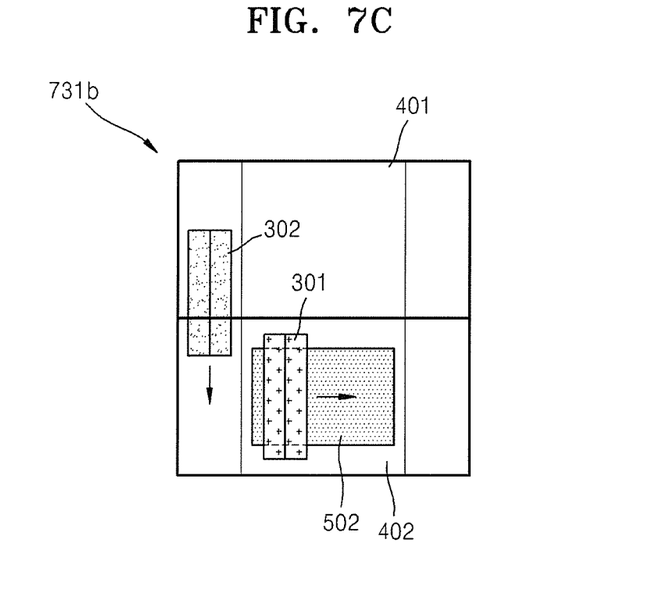

Then, as shown in FIG. 7C, the first deposition source 301 and the second deposition source 302 are respectively moved in a direction of the arrows of FIG. 7C Accordingly, a deposition material for forming the red auxiliary layer (R') that is vaporized in the first deposition source 301 passing above the second substrate 502 is deposited on the second substrate 502.

Meanwhile (e.g., simultaneously to the second substrate being deposited), the deposited first substrate 501 of FIG. 7B is separated from the first stage 401 to be transferred toward the third chamber 731c of FIG. 6 along the first transfer guide unit 201a.

Figure 7D:
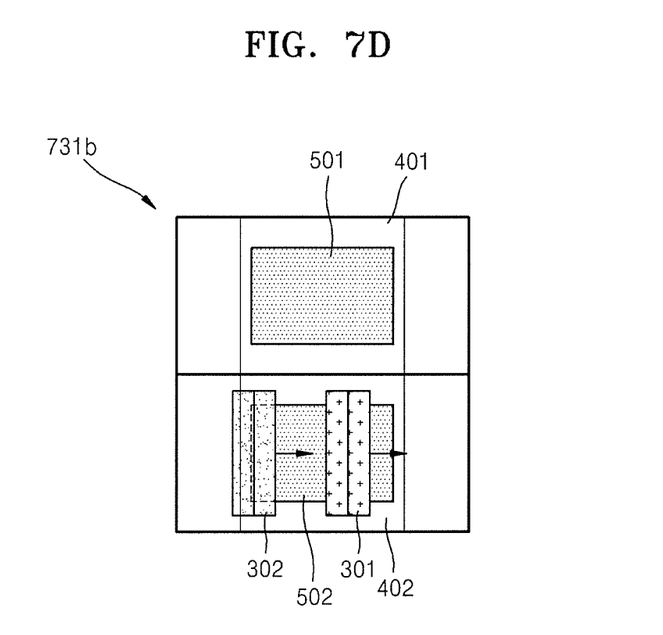

Then, as shown in FIG. 7D, the first deposition source 301 and the second deposition source 302 are respectively moved in a direction of the arrows of FIG. 7D. Accordingly, a deposition material for forming the red auxiliary layer (R') that is vaporized in the first deposition source 301 and a deposition material for forming the red EML (R) that is vaporized in the second deposition source 302 are sequentially deposited on the second substrate 502. As such, while the first deposition source 301 and the second deposition source 302 pass above the second substrate 502, the red auxiliary layer (R') and the red EML (R) are formed.

Meanwhile (e.g., simultaneously to the second substrate 502 being deposited), a subsequent first substrate 501 is transferred from the first chamber 731a of FIG. 6 to the second chamber 731b of FIG. 6 along the first transfer guide unit 201a to be fixed to the first stage 401. Then, a first FMM (not shown) for patterning the red auxiliary layer (R') and the red EML (R) is aligned on the subsequent first substrate 501, and the subsequent first substrate 501 is disposed to closely contact the first FMM.

As described above, in one embodiment, the deposition is continuously performed without time loss by disposing two stages in a single chamber, transporting and aligning the second substrate on the second stage while the first substrate on the first stage is deposited, while the deposition source circulates, or moves, between the two stages of the chamber, and transferring the deposited first substrate from the first stage to the subsequent chamber while the second substrate on the second stage is deposited and a subsequent first substrate is aligned on the first stage. Furthermore, since two deposition sources in one chamber contain deposition materials for forming the red auxiliary layer (R') and the red EML (R), two layers may be deposited using a single FMM process. Accordingly, a tack time of the process may be reduced and productivity may be increased.

In one embodiment, the green auxiliary layer (G') and the green EML (G) are deposited in the third chamber 731c of FIG. 6. The deposition process performed in the third chamber 731c, according to one embodiment, is substantially the same as that in the second chamber 731b, and thus description thereof will be omitted herein. In another embodiment, the green auxiliary layer (G') and the green EML (G) may be deposited in the second chamber 731b, and the red auxiliary layer (R') and the red EML (R) may be deposited in the third chamber 731c.

In another embodiment, the FMM method may also be applied to the first chamber 731a of FIG. 6, in which the common layers are deposited and to the fourth chamber 731d of FIG. 6, instead of the SMS method.

Figure 8:
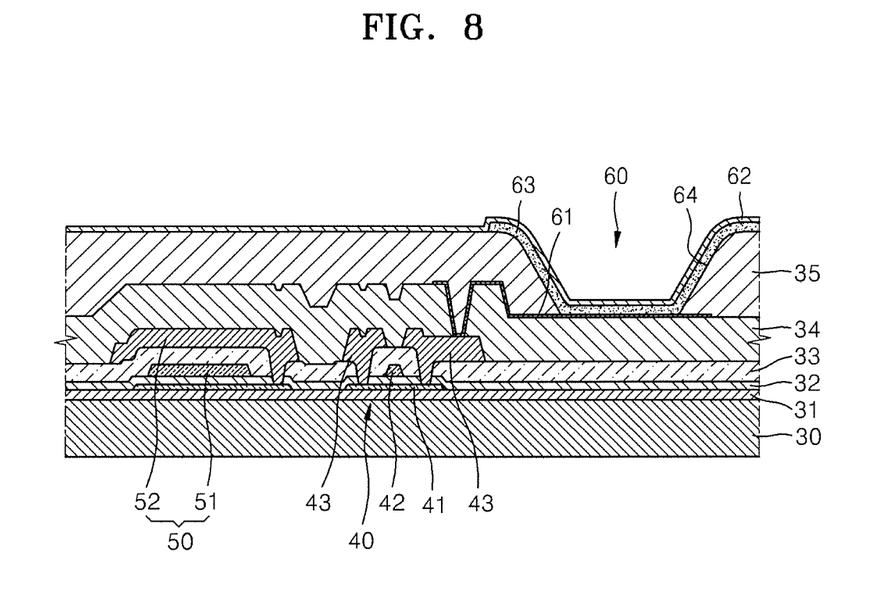
FIG. 8 is a cross-sectional view of an active matrix organic light-emitting display device fabricated by using a thin film deposition apparatus, according to an embodiment of the present invention.

FIG. 8 is a cross-sectional view of an active matrix organic light-emitting display device fabricated by using a thin film deposition apparatus, according to an embodiment of the present invention.

Referring to FIG. 8, the active matrix organic light-emitting display device according to one embodiment is formed on a substrate 30. The substrate 30 may be formed of a transparent material, for example, glass, plastic, or metal. In one embodiment, an insulating layer 31, such as a buffer layer, is formed on an entire surface of the substrate 30.

A thin film transistor (TFT) 40, a capacitor 50, and an organic light-emitting diode (OLED) 60 are disposed on the insulating layer 31, as illustrated in FIG. 8.

A semiconductor active layer 41 is formed on an upper surface of the insulating layer 31 in a predetermined pattern. A gate insulating layer 32 is formed to cover the semiconductor active layer 41. The semiconductor active layer 41 may include a p-type or n-type semiconductor material.

A gate electrode 42 of the TFT 40 is formed in a region of the gate insulating layer 32 corresponding to the semiconductor active layer 41. An interlayer insulating layer 33 is formed to cover the gate electrode 42. The interlayer insulating layer 33 and the gate insulating layer 32 are etched by, for example, dry etching, to form a contact hole exposing parts of the semiconductor active layer 41.

Source/drain electrodes 43 are formed on the interlayer insulating layer 33 to contact the semiconductor active layer 41 through the contact hole. A passivation layer 34 is formed to cover the source/drain electrode 43, and is etched to expose a part of the drain electrode 43. An insulating layer (not shown) may be further formed on the passivation layer 34 so as to planarize the passivation layer 34.

In addition, the OLED 60 displays predetermined image information by emitting red, green, or blue light as current flows. The OLED 60 includes a first electrode 61 disposed on the passivation layer 34. The first electrode 61 is electrically connected to the drain electrode 43 of the TFT 40.

A pixel defining layer 35 is formed to cover the first electrode 61. An opening 64 is formed in the pixel defining layer 35, and an organic emission layer 63 is formed in a region defined by the opening 64. A second electrode 62 is formed on the organic emission layer 63.

The pixel defining layer 35, which defines individual pixels, is formed of an organic material. The pixel defining layer 35 also planarizes the surface of a region of the substrate 30 in which the first electrode 61 is formed, and in particular, the surface of the passivation layer 34.

The first electrode 61 and the second electrode 62 are insulated from each other, and respectively apply voltages of opposite polarities to the organic emission layer 63 to induce light emission.

The organic emission layer 63 may be formed of a low-molecular weight organic material or a high-molecular weight organic material. When the organic emission layer 63 is formed of a low-molecular weight organic material, the organic emission layer 63 may be formed as a single- or multi-layer stack structure including at least one layer selected from the group consisting of a hole injection layer (HIL), a hole transport layer (HTL), an emission layer (EML), an electron transport layer (ETL) and an electron injection layer (EIL). Such a low-molecular weight organic material may be deposited by vacuum deposition using the thin film deposition apparatus described above with reference to FIG. 1.

After the organic emission layer 63 is formed, the second electrode 62 may be formed by the same deposition method used to form the organic emission layer 63.

The first electrode 61 may function as an anode, and the second electrode 62 may function as a cathode. Alternatively, the first electrode 61 may function as a cathode, and the second electrode 62 may function as an anode. The first electrode 61 may be patterned to correspond to individual pixel regions, and the second electrode 62 may be formed to cover all the pixels.

The first electrode 61 may be formed as a transparent electrode or a reflective electrode. Such a transparent electrode may be formed of indium tin oxide (ITO), indium zinc oxide (IZO), zinc oxide (ZnO), or indium oxide ($In_2O_3$). Such a reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr) or a compound thereof and forming a layer of ITO, IZO, ZnO, or $In_2O_3$ on the reflective layer. The first electrode 61 may be formed by forming a layer by, for example, sputtering, and then patterning the layer by, for example, photolithography.

The second electrode 62 may also be formed as a transparent electrode or a reflective electrode. When the second electrode 62 is formed as a transparent electrode, the second electrode 62 functions as a cathode. To this end, such a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on a surface of the organic emission layer 63 and forming an auxiliary electrode layer or a bus electrode line thereon from ITO, IZO, ZnO, $In_2O_3$, or the like. When the second electrode 62 is formed as a reflective electrode, the reflective layer may be formed by depositing Li, Ca, LiF/Ca, LiF/Al, Al, Ag, Mg, or a compound thereof on the entire surface of the organic emission layer 63. The second electrode 62 may be formed by using the same deposition method used to form the organic emission layer 63 described above.

The thin film deposition apparatuses according to the embodiments of the present invention described above may be applied to form an organic layer or an inorganic layer of an organic TFT, and to form layers from various materials.

As described above, a thin film deposition apparatus according to embodiments of the present invention is suitable for manufacturing large-size display devices on a mass scale and can be used for high-definition patterning. The thin film deposition apparatus according to embodiments of the present invention may be used to manufacture an organic light-emitting display device.

While the present invention has been particularly shown and described with reference to some exemplary embodiments thereof, it will be understood by those of ordinary skill in the art that various changes in form and details may be made therein without departing from the spirit and scope of the present invention as defined by the following claims.

What is claimed is:

1. A method of manufacturing an organic light-emitting display device by using a thin film deposition apparatus, the method comprising:
    transferring a first substrate into a first chamber such that the first substrate is fixed to a first stage and aligned with respect to a first mask;
    depositing deposition materials discharged from first and second deposition sources on the first substrate that is fixed to the first stage in the first chamber while moving the first and second deposition sources relative to the first substrate;
    transferring a second substrate into the first chamber such that the second substrate is fixed to a second stage and aligned with respect to a second mask while the deposition materials are deposited on the first substrate in the first chamber; and
    depositing deposition materials discharged from the first and second deposition sources on the second substrate that is fixed to the second stage in the first chamber while moving the first and second deposition sources relative to the second substrate,
    wherein the first and second deposition sources are moved along a closed-loop in the first chamber while sequentially depositing the deposition materials on the first and second substrates.

2. The method of claim 1, wherein depositing the deposition materials on the first substrate and depositing the deposition materials on the second substrate are performed by sequentially depositing a deposition material of the deposition materials for forming a red auxiliary layer and contained in the first deposition source and a deposition material of the deposition materials for forming a red emission layer and contained in the second deposition source.

3. The method of claim 1, wherein depositing the deposition materials on the first substrate and depositing the deposition materials on the second substrate are performed by sequentially depositing a deposition material of the deposition materials for forming a green auxiliary layer and contained in the first deposition solace and a deposition material of the deposition materials for forming a green emission layer and contained in the second deposition source.

4. The method of claim 1, wherein the first and second deposition sources are moved at as same rate along a same trajectory.

5. The method of claim 1, wherein the second deposition source is moved along a trajectory of the first deposition source.

6. The method of claim 1, wherein the first and second deposition sources are moved along the closed-loop in the first chamber while sequentially depositing the deposition materials on the first and second substrates in a continuous manner.

7. The method of claim 1, further comprising separating at least one of the first or second substrates having the deposition materials deposited thereon from the first or second mask and transferring the at least one first or second substrate outside of the first chamber.

8. The method of claim 1, wherein transferring the first and second substrates into the first chamber and depositing deposition materials on the first and second substrates are repeatedly performed.

9. An organic light-emitting display device manufactured using the method of claim 1.

10. A method of manufacturing an organic light-emitting display device by using a thin film deposition apparatus, the method comprising:
    transferring a first substrate into a first chamber such that the first substrate is fixed to a first stage and aligned with respect to a first mask;
    depositing deposition materials discharged from first and second deposition sources on the first substrate while moving the first and second deposition sources relative to the first substrate;
    transferring a second substrate into the first chamber such that the second substrate is fixed to a second stage and aligned with respect to a second mask while the deposition materials are deposited on the first substrate;
    depositing deposition materials discharged from the first and second deposition sources on the second substrate while moving the first and second deposition sources relative to the second substrate;
    supporting at least one of the first and second substrates by a chuck;
    spacing the at least one substrate apart from a thin film deposition assembly; and
    moving at least one of the at least one substrate or the thin film deposition assembly relative to the other while discharging another deposition material on the at least one substrate, wherein the thin film deposition assembly comprises:
a second chamber adjacent a side of the first chamber;
a deposition source in the second chamber and discharging the another deposition material;
a deposition source nozzle unit arranged at a side of the deposition source and comprising a plurality of deposition source nozzles arranged in a first direction;
a patterning slit sheet arranged opposite to the deposition source nozzle unit and comprising a plurality of patterning slits arranged in the first direction; and
a barrier plate assembly comprising a plurality of barrier plates arranged between the deposition source nozzle unit and the patterning slit sheet in the first direction and partitioning a space between the deposition source nozzle unit and the patterning slit sheet into a plurality of sub-deposition spaces.

* * * * *